(12) United States Patent
Marchman et al.

(10) Patent No.: US 7,351,966 B1
(45) Date of Patent: Apr. 1, 2008

(54) HIGH-RESOLUTION OPTICAL CHANNEL FOR NON-DESTRUCTIVE NAVIGATION AND PROCESSING OF INTEGRATED CIRCUITS

(75) Inventors: Herschel M. Marchman, Austin, TX (US); Steven B. Herschbein, Hopewell Junction, NY (US); Chad Rue, Poughkeepsie, NY (US); Michael Renner, Highland, NY (US); Narender Rana, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 143 days.

(21) Appl. No.: 11/419,811

(22) Filed: May 23, 2006

(51) Int. Cl.
*H01J 37/244* (2006.01)
(52) U.S. Cl. .................. 250/306; 250/309; 250/310
(58) Field of Classification Search .............. 250/306, 250/309, 310
See application file for complete search history.

(56) References Cited

U.S. PATENT DOCUMENTS 4,929,041 A * 5/1990 Vahala et al. ............... 385/116
6,191,429 B1 * 2/2001 Suwa ......................... 250/548

* cited by examiner

Primary Examiner—Kiet T. Nguyen
(74) Attorney, Agent, or Firm—Todd M. C. Li

(57) ABSTRACT

An optical-fiber based light channel system is included in an ion/electron beam tool for imaging and/or processing integrated circuits. The optical channel system includes an image collection portion, an optical fiber image transmission portion and a detector portion. The image collection portion includes micro-optical components and has submillimeter dimensions, so that it is easily accommodated within the working distance of the ion/electron beam tool. The entire system is sufficiently compact and lightweight so that it may easily be mounted on a translation stage inside the sample chamber, which permits the optical channel to be mechanically extended and retracted to avoid blocking the primary ion or electron beam. The system may be mounted to a translation stage or to a gas injector assembly, which may itself be mounted to a flange plate on the chamber wall with feed-through ports for electrical and optical signals.

20 Claims, 7 Drawing Sheets

HIGH-RESOLUTION OPTICAL CHANNEL FOR NON-DESTRUCTIVE NAVIGATION AND PROCESSING OF INTEGRATED CIRCUITS

FIELD OF THE INVENTION

This invention relates to the manufacture of advanced integrated circuits, and particularly to repair and measurement of integrated circuits in focused-ion-beam (FIB) tools, scanning electron microscopes (SEMs), and similar environments.

BACKGROUND OF THE INVENTION

Current repair processes for integrated circuit (IC) chips and for lithographic exposure reticles (i.e. masks) generally rely on formation of highly localized areas of energy on the surfaces thereof, to induce spatially confined endothermic reactions for selective etching or deposition of materials. Focused beams of ions, electrons or photons are used to form these localized areas. Focused ion beams (FIBs) have been shown to have superior process confinement and reaction rates compared to focused electron beams (e.g. in SEMs) or laser beams. FIB tools have thus assumed a dominant role in most repair applications, as well as for site-specific cross-sectioning in the failure analysis of ICs.

Serious difficulties in chip and mask repair have recently been encountered due to the introduction of new materials and structures that are not compatible with conventional FIB processes. In particular, chips with copper metallization and/or polymeric low-k dielectrics present challenges in the selective removal of metal in back-end-of-the-line processing ("BEOL chip edit"). FIG. 1 illustrates a typical edit process where a FIB 10 is directed into an opening 1 exposing a metal line 12 in a substrate 2. The FIB milling of the copper forms conductive byproducts having low volatility, so that deposits 13 of conductive material are formed on the walls of the opening 1. Scattering of the ion beam also causes damage to the interlevel dielectric 2 in areas 14 along the wall. Polymer-based organic interlevel dielectrics may even become conductive when exposed to the ion beam.

In addition, imaging the chip surface with FIB or SEM (electron beams) during navigation to the repair site can result in damage to the interlevel dielectric material. Similarly, exposure to an ion beam in a mask repair process may lead to undesired changes in the optical index of the mask features (an effect often referred to as "staining").

Besides materials-related issues, the constantly increasing packing density of IC features (that is, reduction in the minimum spacing between features) leads to serious problems in editing ICs and masks. The difficulty of editing a feature without disturbing its nearest neighbors rapidly increases as the spacing between features decreases. The minimum feature spacing is the major factor limiting the use of optical techniques for editing (e.g. laser beam based editing), due to the optical diffraction limit of spatial resolution for these techniques. In the case of ion and electron beam editing, the area of spatial confinement of the beam is much larger than the primary spot size. In general, the spatial resolution of beam-induced processing is an order of magnitude worse than the imaging resolution of the beam-generating apparatus (FIB or SEM).

Metrology for ICs presents additional challenges. In-line measurements are needed to provide accurate three-dimensional data for IC fabrication process development and control in the IC manufacturing line. The feature to be measured must be sectioned without changing the shape of the original structure before the profile measurement is performed. In a typical FIB- or SEM-based profile metrology process, ion- or electron-beam induced deposition is performed to encapsulate the structure to be sectioned. However, damage to the original surface may occur due to exposure to the ion or electron beam before an adequate thickness of a protective layer is deposited.

The arrangement of components inside typical FIB and SEM chambers makes it difficult to view the sample being processed. FIB and SEM chambers generally cannot accommodate a conventional optical microscope for directly viewing the sample, or for providing optical exposure to the region of the sample interacting with the beam. Two proposed solutions to this problem are as follows: (1) A Schwartzschild reflective microscope with an infrared (IR) objective lens, built into the ion beam forming column; this type of in-situ optical microscope requires a large physical working distance, resulting in a low numerical aperture (NA) and relatively poor image resolution. (2) An in-situ microscope column physically offset from the beam-to-sample interaction region, so that the sample must be shifted back and forth with a known offset.

It is desirable to obtain a magnified image of the sample, but space limitations inside the FIB/SEM chamber generally require that the working distance be very small. This in turn causes difficulties in illuminating the sample, and requires an approach different from conventional endoscopy. Endoscopes typically produce de-magnified images of macroscopic areas, such as the inner walls of a patient's colon or the interior of an engine cylinder. Since a large working distance (typically more than 5 mm) is used in conventional endoscopic devices, sample illumination can be provided using a light source and optical fibers positioned off-axis with respect to the main image collection fiber. However, to obtain magnification with the appropriate NA (that is, no false magnification), the working distance must be reduced to a value typically less than the diameter of the imaging lens. This means that any off-axis illumination scheme would result in physical shadowing by the imaging objective lens. Accordingly, lack of illumination of the sample region of interest has been one of the critical issues limiting the ability to produce magnified (e.g. >10×) images with an endoscope. In addition, magnification after image translation is not feasible due to the intrinsic resolution loss caused by fiber-based image guides. Resolution loss occurs in coherent fiber bundle image transmission because of the finite spacing achievable between pixel elements. In the case of single fiber-based gradient index (GRIN) image guides, which behave as a train of convex lenses continually refocusing light toward the optical axis, resolution is lost due to the intrinsically low NA.

There is a need for an apparatus and technique (i) for preventing or limiting damage caused by ion or electron beam repair or metrology processes; (ii) for navigating to a feature of interest on the surface of the chip or mask without subjecting a large surface area to beam damage; and (iii) for conveniently viewing the sample in the process chamber.

SUMMARY OF THE INVENTION

The present invention addresses the above-described need by providing an optical-fiber based light channel system included in the ion/electron beam tool (FIB or SEM). The optical channel system includes an image collection portion, an optical fiber image transmission portion and a detector portion. The image collection portion includes micro-optical components and has submillimeter dimensions, so that it is easily accommodated within the working distance of the ion/electron beam tool (that is, within about 5 mm from the workpiece). The entire system is sufficiently compact and lightweight so that it may easily be mounted on a translation stage inside the sample chamber, which permits the optical channel to be mechanically extended and retracted to avoid blocking the primary ion or electron beam. The system may be mounted to a translation stage or to a gas injector assembly, which may itself be mounted to a flange plate on the chamber wall with feed-through ports for electrical and optical signals.

The image transmission portion advantageously includes two optical channels substantially parallel to each other; the first optical channel for transmitting the image information; and the second optical channel for transmitting the illumination. The first optical channel preferably has a diameter greater than that of the second optical channel. The optical channel(s) may be a coherent bundle of optical fibers.

In addition, the first optical channel may be adapted to transmit illumination to the workpiece, so that the workpiece is illuminated using both the first optical channel and the second optical channel.

The system may further include a gas delivery system for delivering a reactant to the area of the workpiece, so that illumination from the optical channel (e.g. by a laser) promotes a chemical reaction between the reactant and workpiece material.

The image collection portion and the image transmission portion may also be adapted to deliver infrared image information to the detector, thereby indicating a temperature of the area of the workpiece.

DETAILED DESCRIPTION OF PREFERRED EMBODIMENTS OF THE INVENTION

Figure 1:
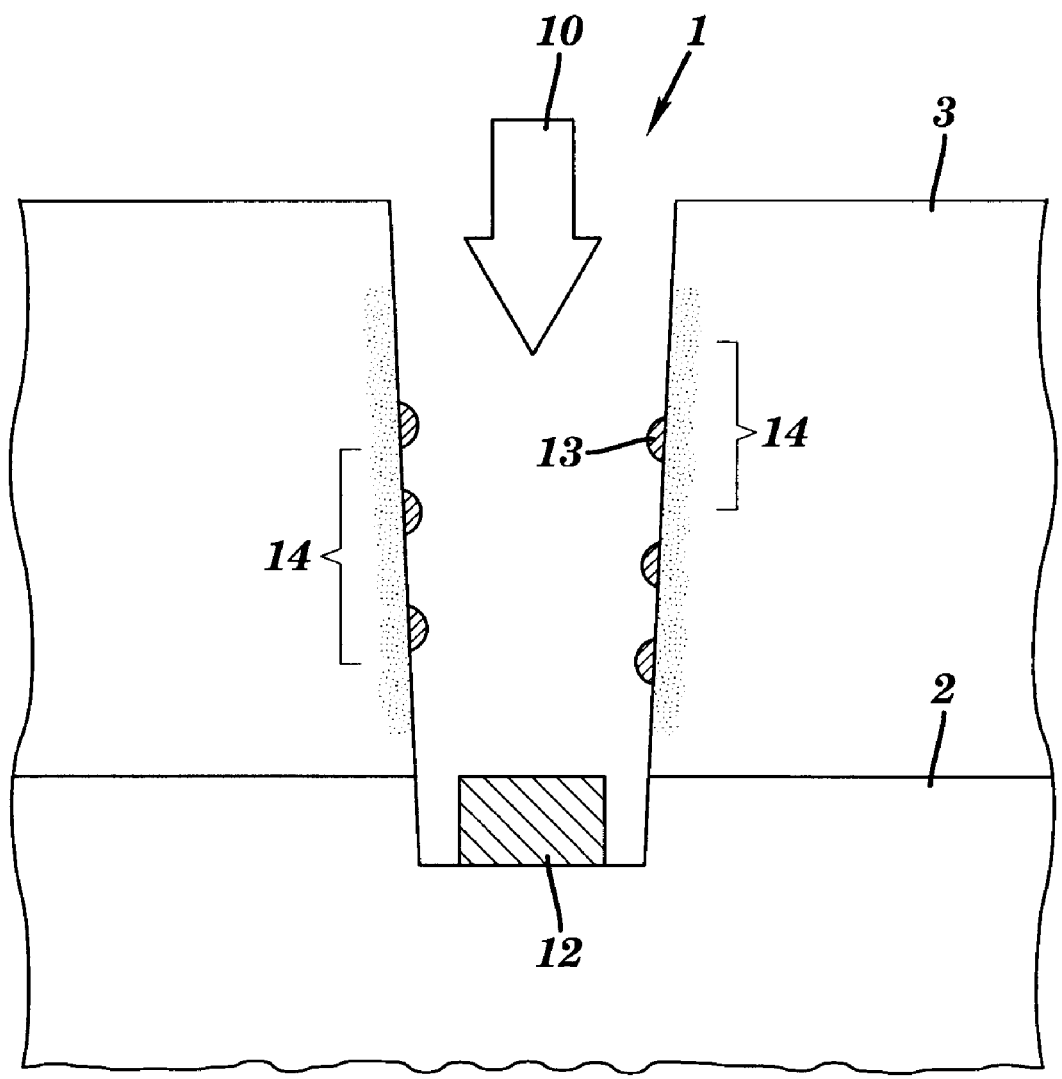
FIG. 1 illustrates undesirable deposition and damage effects in a chip edit process in a conventional FIB tool.
Figure 2:
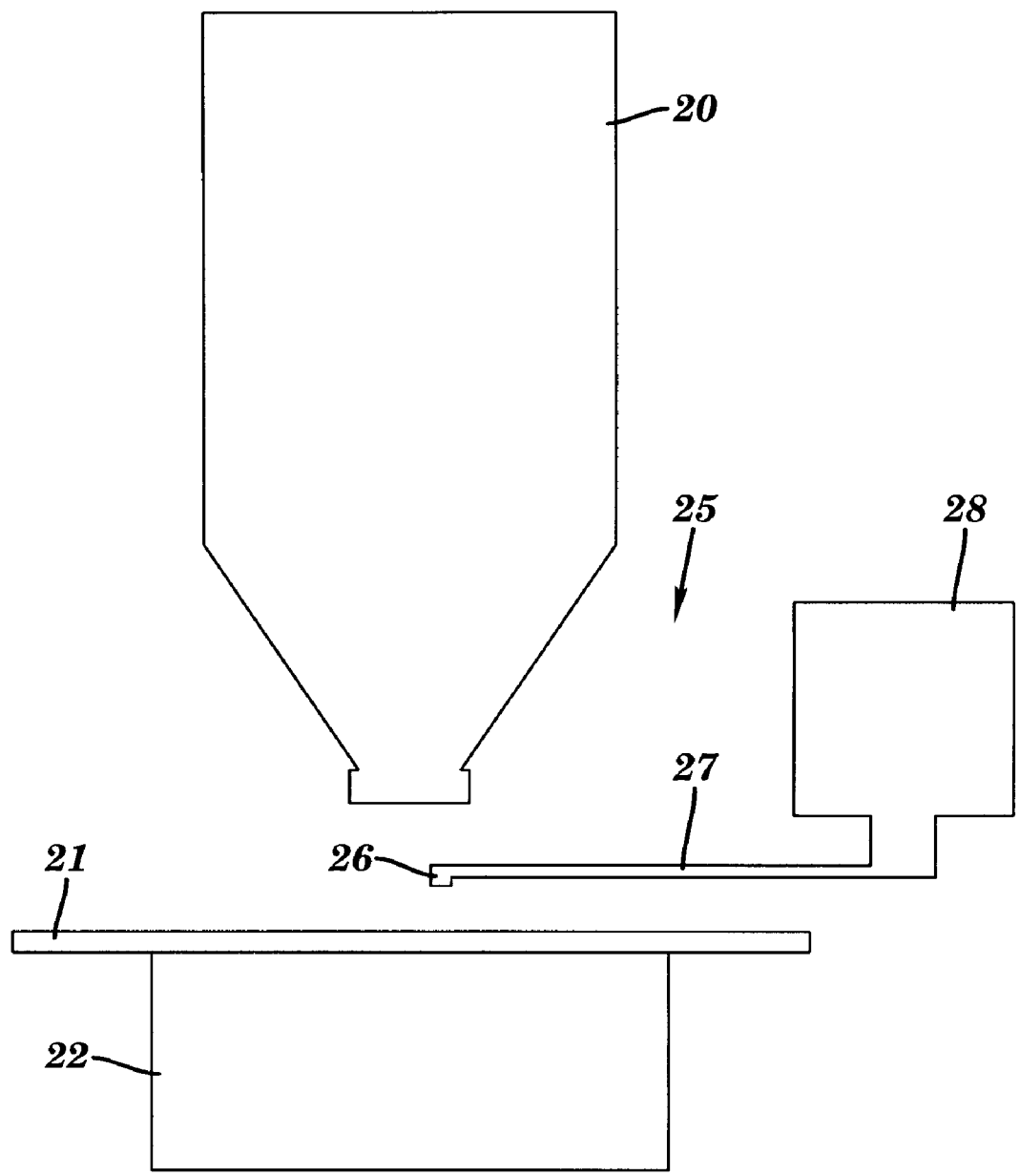
FIG. 2 schematically illustrates an optical channel installed in a FIB processing tool, in accordance with an embodiment of the invention.

In a preferred embodiment of the invention, an optical-fiber based light channel system is included in the ion/electron beam processing tool. The interior of an FIB tool (a vacuum chamber) with a light channel system is shown in FIG. 2. Sample 21 is mounted on an XYZ motion stage 22, opposite the ion beam column 20. The optical channel system 25 includes an image collection portion 26, an optical fiber image transmission portion 27 and a detector portion 28. The image collection portion 26 includes micro-optical components (e.g. lenses and beam splitters) and has submillimeter dimensions, so that it is easily accommodated between the ion/electron column objective pole piece and the sample (i.e. within the working distance of the FIB or SEM tool). The sample 21 (typically with a repair or metrology site thereon) may therefore remain in a fixed position with respect to the column 20. The entire system 25 is sufficiently compact and lightweight so that it may easily be mounted on a translation stage inside the sample chamber, which permits the optical channel to be mechanically extended and retracted to avoid blocking the primary ion or electron beam. For example, the system 25 could be mounted to a gas injector translation assembly or to a separate XYZ translation stage. Either of these configurations may itself be mounted to a flange plate on the chamber wall with feed-through ports for electrical and optical signals.

Figure 3:
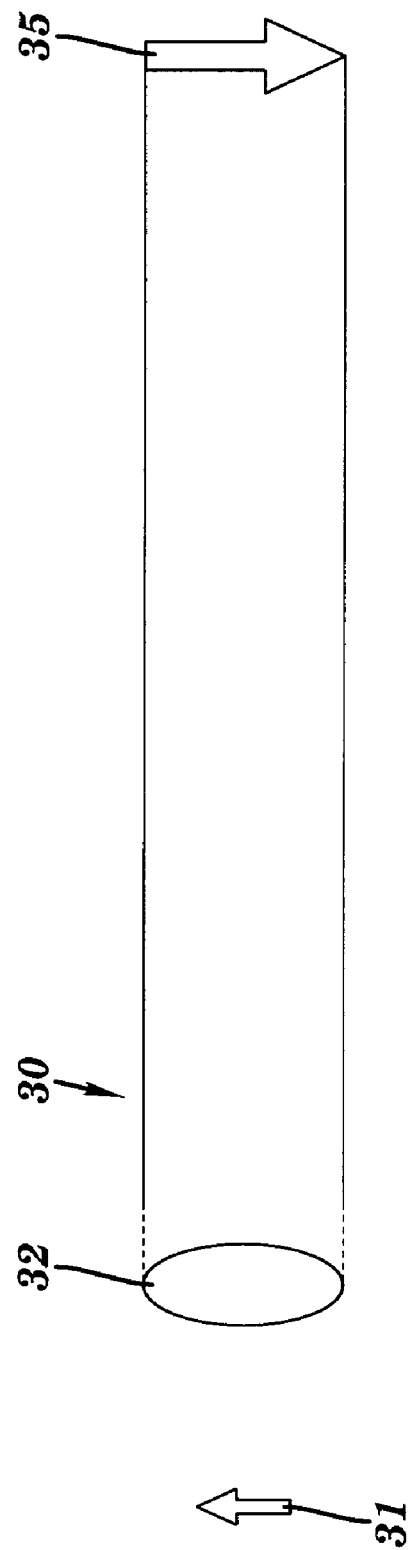
FIG. 3 is a simplified diagram of image transmission in an optical channel in accordance with the invention.

A simplified diagram of the image collection and transmission portions of the optical channel of the present invention, illustrating magnification of an object on the sample, is shown in FIG. 3. The object 31 is imaged by the micro-objective lens 32, and the image is translated by an optical fiber channel 30 to another region of the FIB/SEM chamber for viewing.

Figure 4:
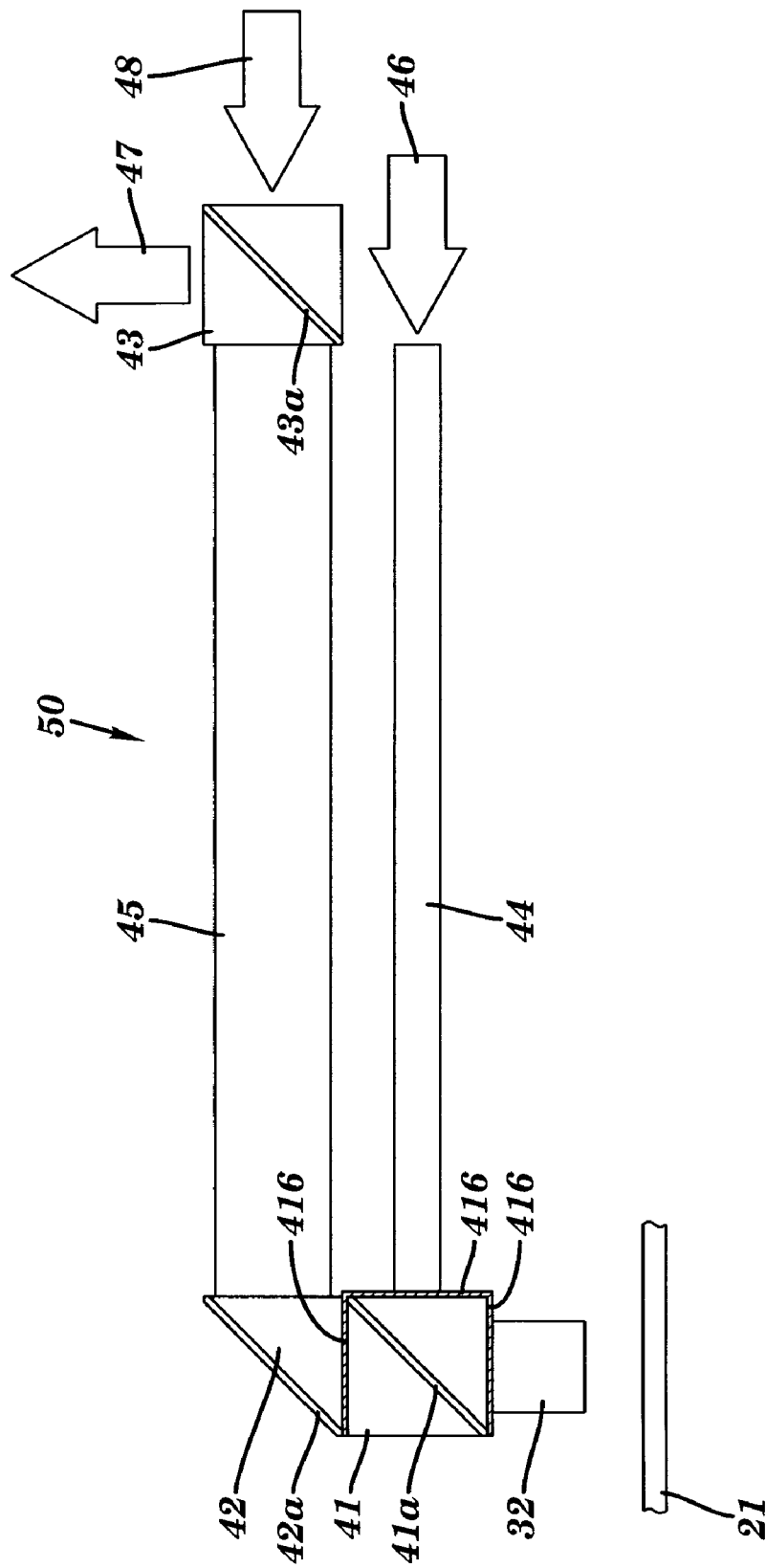
FIG. 4 shows details of an optical channel constructed in accordance with an embodiment of the invention.

The magnification of the object 31 is performed with a very short working distance; as mentioned above, this raises difficulties regarding illumination of the object. Unlike endoscope-based inspection devices, the optical system of the present invention magnifies the image with high NA before translation for viewing. The problem of sample illumination at short working distances is solved by introducing the illumination in-line, through the same micro-objective lens used to collect the image. A preferred configuration of optical components is shown in FIG. 4. A portion of the sample 21 is imaged using micro-objective lens 32; the image is rotated 90 degrees by a micro-prism 42 having a reflective hypotenuse 42a. The optical fiber image transmission guide 45 is thus oriented parallel to the sample surface. Another micro-prism 43, with reflective surface 43a, is located at the other end of the transmission guide to direct the image 47 into an image collection device (e.g. a CCD camera, not shown). Sample illumination 46 is transmitted through a multi-mode optical fiber channel 44 and directed towards the objective lens using micro-cube beam-splitter 41 with reflective surface 41a. (Microcube 41 also has $\lambda/4$ partially-reflective surfaces 41b.) Illumination 46 is preferably monochromatic red light, in order to optimize contrast, minimize stray light and reduce source imaging. Illumination 48 from an additional light source is transmitted through image transmission guide 45 and reflected toward the sample; this illumination may be laser radiation (e.g. green laser light suitable for photo-induced processing). It is advantageous for multi-mode optical fiber channel 44 to be smaller in diameter than image transmission channel 45, in order to reduce stray light and increase coherence for optimum contrast and edge definition within the image. The multi-mode optical fiber channel effectively acts as an illumination source iris aperture.

Image transmission channel 45 may be single gradient index fiber, or alternatively a coherent bundle of step-index fiber pixels. A gradient index fiber has the advantage of preserving phase. A coherent bundle of fibers may be preferred if mechanical flexibility of the channel is required.

It is noteworthy that this optical system, in addition to collecting visible light images, is capable of detecting infrared intensity, thereby permitting in-situ monitoring of the sample temperature to control photo-thermally induced processes. This capability could be expanded to include in-situ spectroscopic and/or interferometric monitoring and control techniques.

Figure 5:
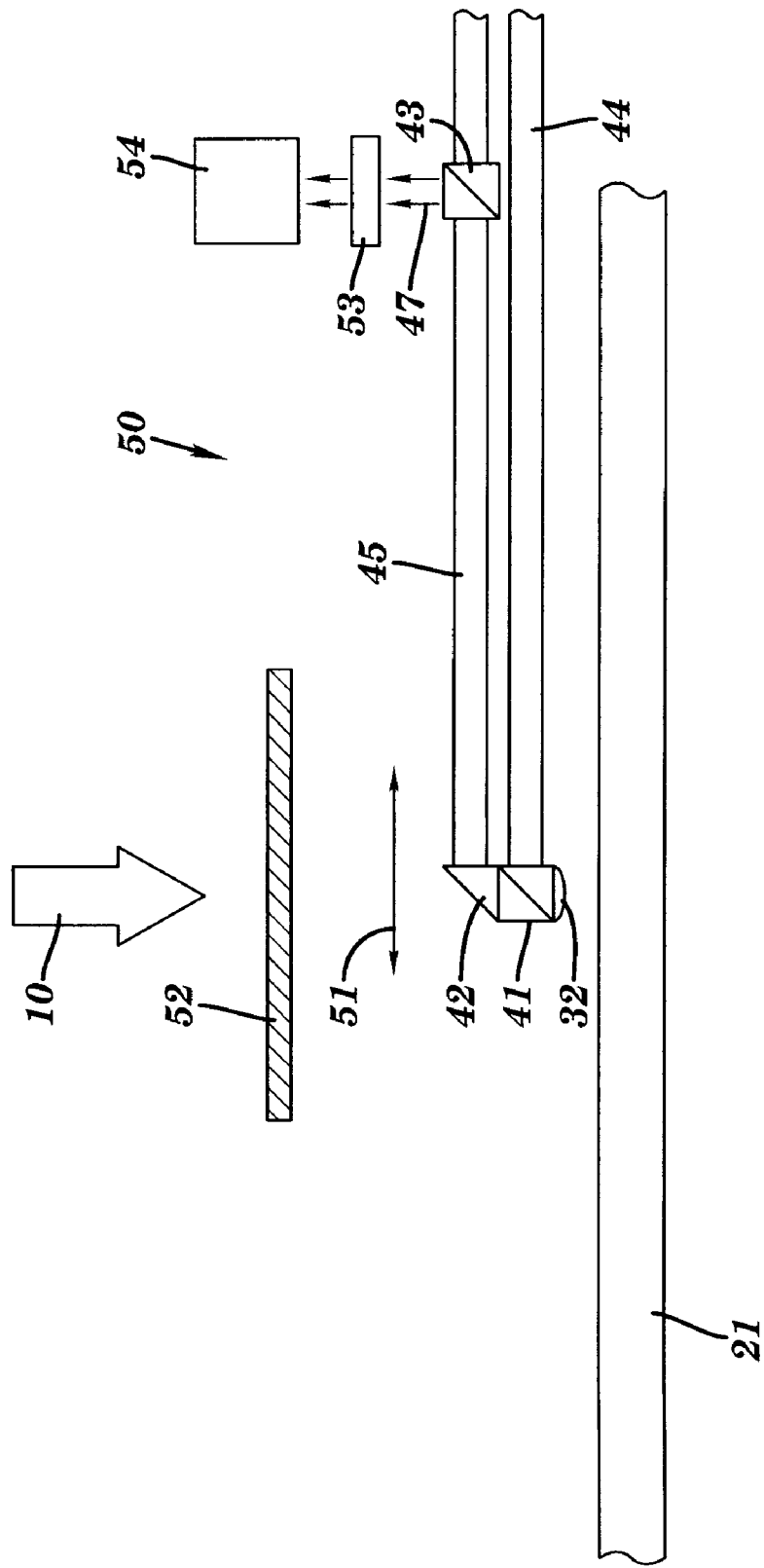
FIG. 5 schematically illustrates a processing tool including the optical channel of FIG. 4.

FIG. 5 shows the optical imaging system 50 of FIG. 4 installed in a focused-ion beam (FIB) apparatus. The illumination and image transmission guides 44, 45, together with objective lens 32, micro-cube 41 and micro-prism 42, can be extended and retracted in the direction 51 over the surface of the sample 21. In this embodiment, illumination guide 44 transmits red light for forming an image of the sample. As shown in FIG. 5, the guides (optical fiber channels) are moved parallel to the sample surface and only a short distance above it (typically less than about 5 mm). When the system 50 is extended so as to image the area of the sample in the path of the beam, the ion beam 10 is blocked by a beam blank 52. The image 47 is directed through a filter 53 for red light and into detector (e.g. CCD camera) 54. A secondary lens may be used instead of, or in addition to, filter 53 to refocus the image onto the detector (or other viewing device), in order to optimize resolution and contrast.

Figure 6:
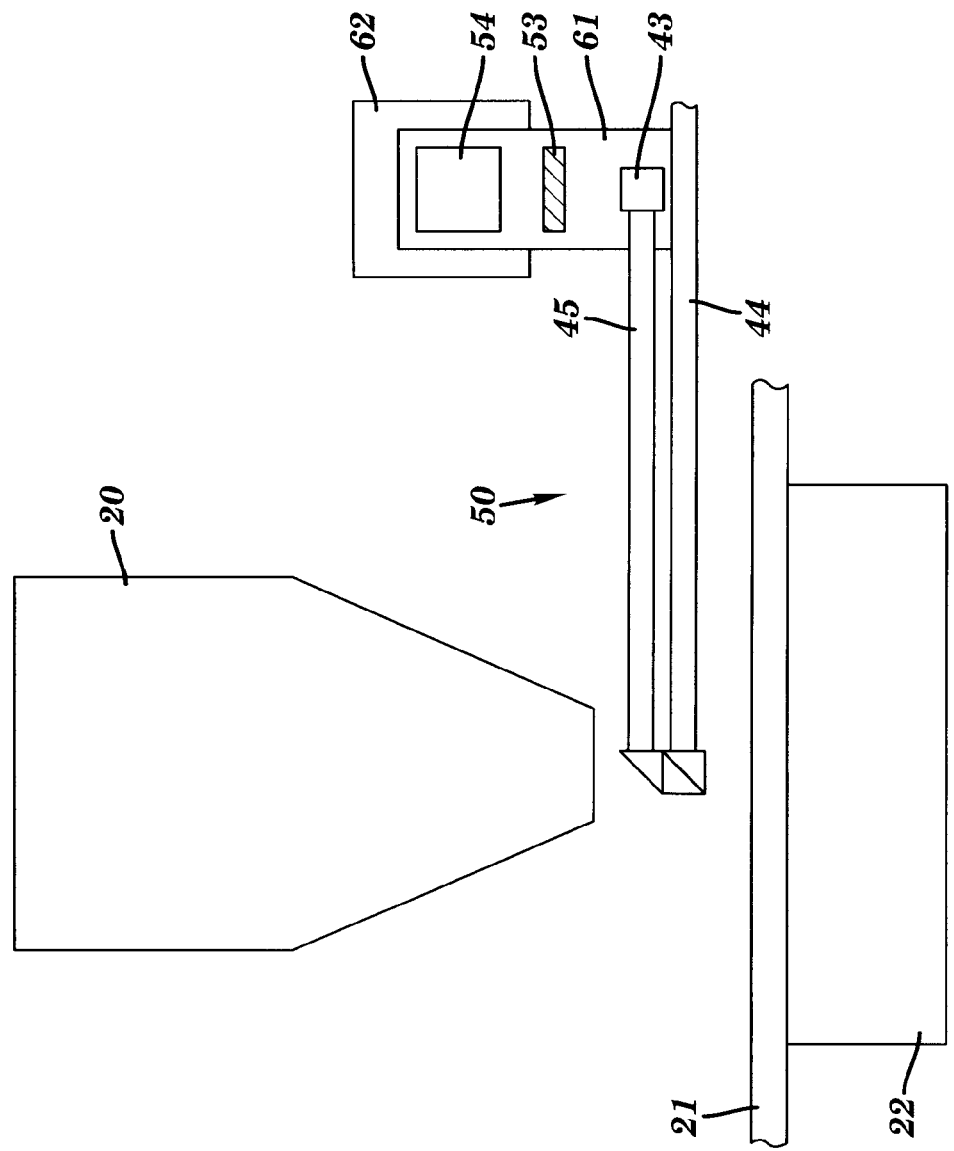
FIG. 6 schematically illustrates a processing tool including an optical channel connected to an XYZ motion stage, in accordance with an embodiment of the invention.

A more general cross-sectional view of a FIB tool (or SEM), incorporating an optical imaging system as in the present invention, is shown in FIG. 6. The column 20 is located over sample 21, with the sample resting on an XYZ motion stage 22. Another XYZ motion stage 61 has various components of the imaging system 50 (e.g. optical fiber channels 44, 45, micro-cube 43, filter 53 and imaging device 54) attached thereto. The XYZ motion stage 61 extends and retracts the optical system with respect to the beam path, aligns the system with respect to the FIB beam center (or SEM image center), and focuses the objective lens on the sample. The motion stage 61 may itself be conveniently mounted on a flange 62 of the tool chamber. An existing FIB/SEM tool may thus be easily adapted to include the optical imaging system. Flange 62 may include feedthroughs for electrical connections to control devices (not shown) including a computer with appropriate control software.

Figure 7:
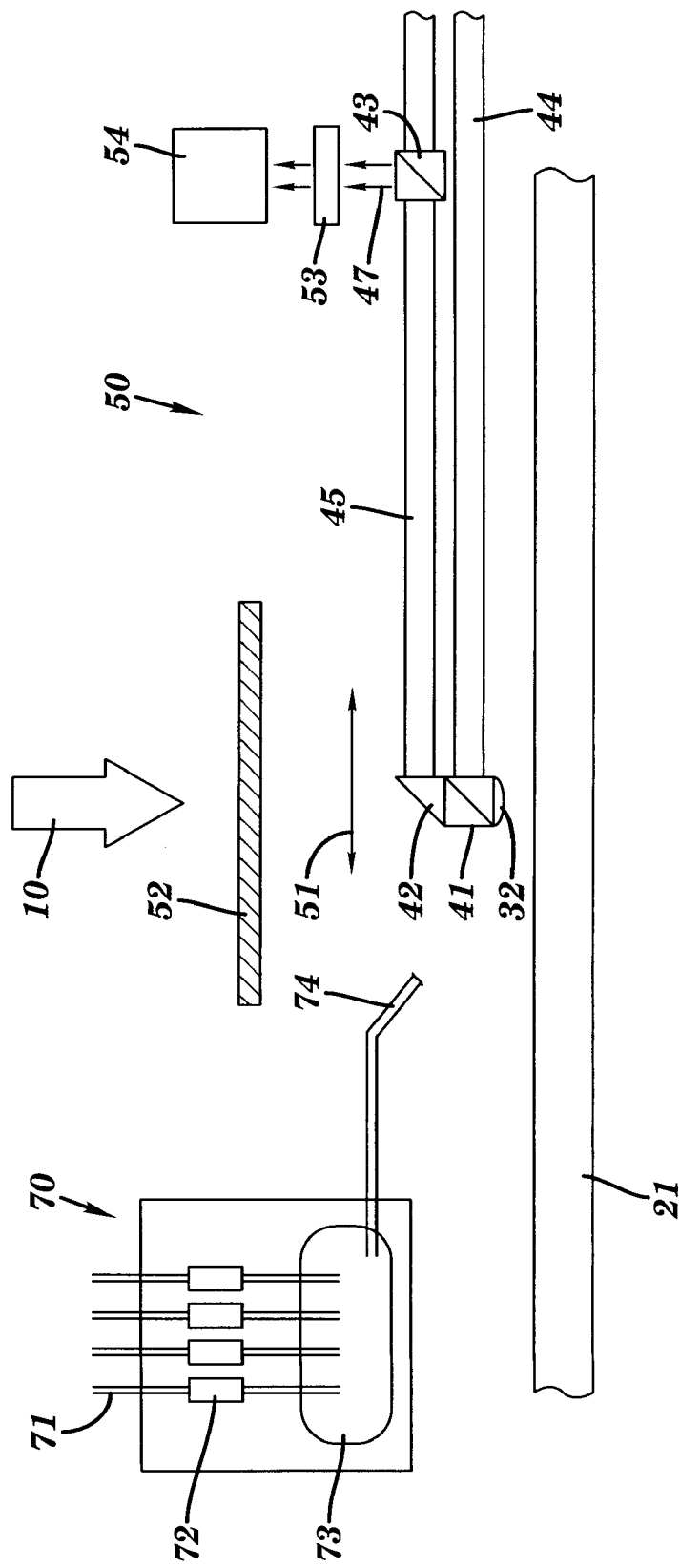
FIG. 7 illustrates the processing tool of FIG. 5 adapted to enable photolytic and photochemical reactions at a repair/metrology site, in accordance with another embodiment of the invention.

If it is desired to perform and observe photolytic and photochemical reactions at a repair/metrology site of the sample, a gas delivery system 70 is added to the optical imaging system in the chamber as shown in FIG. 7. Multiple gas inlets 71, with micro-dispensing valves 72, feed into a manifold 73 with a single output nozzle 74 for delivery of the desired gas mixture to the site. As mentioned above, a secondary optical source, such as a green (488 nm argon) laser, may be coupled to the image transmission guide 45 to induce photolytic reactions; similarly, infrared or visible laser radiation may be used to induce photothermal reactions.

It will be appreciated that the optical imaging system of the present invention offers numerous advantages, including:

The micro-objective lens has a perpendicular angle of incidence to the sample, with a short working distance and high numerical aperture. This permits spatial resolution (for either imaging or performing photo- or thermochemical processes) in the submicron range.

2) In-line, coaxial illumination of the sample permits high-resolution imaging in a small space with a short working distance.

3) Various optical components (e.g. polarization filters, apertures, micro-beamsplitters, and detectors) may be integrated into the system (e.g. micro-cube 43, transmitting illumination while redirecting the image to a detector).

4) Source imaging is minimized (and illumination uniformity thus maximized) by reducing the distance between the objective and the illumination source.

5) The optical fiber image transmission guide translates the image to a region of the tool chamber where other optical components may be conveniently located.

6) A light source for photo-processing may easily be added to the system, by using the image transmission channel and a beamsplitter near the viewing/imaging device (e.g. laser illumination 48, micro-cube 43).

7) The high numerical aperture is suitable for non-contact infrared pyrometry (for sensing and controlling the sample temperature) and for non-contact spectrometry in the visible or infrared (for sensing and controlling chemical processes in situ).

While the invention has been described in terms of a specific embodiment, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A system for forming a high-resolution image of an area of a workpiece disposed in a chamber of a charged-particle beam device characterized by a working distance with respect to the workpiece, the system comprising:
   an image collection portion having an axis normal to the workpiece;
   an image transmission portion including an optical channel having an axis substantially parallel to the workpiece and an optical component at a distal end thereof for directing image information from the image collection portion to the optical channel; and
   a detector portion for detecting the image information, wherein
   the image collection portion and the image transmission portion are located within the working distance, and
   the image transmission portion transmits illumination to the area of the workpiece.

2. A system according to claim 1, further comprising a translation device for extending the image collection portion to the area of the workpiece and retracting the image collection portion therefrom.

3. A system according to claim 2, wherein the translation device is mounted on a removable portion of a wall of the chamber.

4. A system according to claim 2, wherein the optical channel includes a flexible optical fiber and the optical fiber flexes when the translation device retracts the image collection portion.

5. A system according to claim 1, wherein the image transmission portion further comprises
   a first optical channel for transmitting the image information; and
   a second optical channel for transmitting the illumination, the first optical channel and the second optical channel being substantially parallel.

6. A system according to claim 5, wherein the first optical channel and the second optical channel each include an optical fiber.

7. A system according to claim 5, wherein the first optical channel has a diameter greater than that of the second optical channel.

8. A system according to claim 5, wherein the first optical channel is adapted to transmit illumination to the workpiece, so that the workpiece is illuminated using both the first optical channel and the second optical channel.

9. A system according to claim 1, wherein the optical channel includes an optical fiber.

10. A system according to claim 9, wherein the optical channel has a coherent bundle of optical fibers.

11. A system according to claim 9, wherein the optical fiber is a gradient index fiber.

12. A system according to claim 11, wherein the gradient index fiber preserves a phase of the image information.

13. A system according to claim 1, further comprising a gas delivery system for delivering a reactant to the area of the workpiece, and wherein illumination from the optical channel promotes a chemical reaction between the reactant and workpiece material.

14. A system according to claim 1, wherein the image collection portion and the image transmission portion are within about 5 mm of the workpiece.

15. A system according to claim 1, wherein the image collection portion and the image transmission portion are adapted to deliver infrared image information to the detector, thereby indicating a temperature of the area of the workpiece.

16. A system according to claim 1, wherein the optical component comprises a prism for directing the image information through an angle of 90 degrees.

17. A system according to claim 1, wherein the optical component includes a beamsplitter.

18. A system according to claim 1, further comprising a second optical component for directing the image information to the detector portion.

19. A system according to claim 1, wherein the charged-particle beam device is one of a focused ion beam (FIB) tool and a scanning electron microscope (SEM).

20. A system according to claim 19, wherein the area of the workpiece is centered at the beam center of the beam device.

* * * * *